(12) United States Patent
Chen et al.

(10) Patent No.: US 12,526,912 B2
(45) Date of Patent: Jan. 13, 2026

(54) CARRIER STRUCTURE

(71) Applicant: SILICONWARE PRECISION INDUSTRIES CO., LTD., Taichung (TW)

(72) Inventors: Chien-Sheng Chen, Taichung (TW); Chia-Chu Lai, Taichung (TW); Ho-Chuan Lin, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 203 days.

(21) Appl. No.: 18/458,452

(22) Filed: Aug. 30, 2023

(65) Prior Publication Data
US 2024/0407079 A1    Dec. 5, 2024

(30) Foreign Application Priority Data
Jun. 2, 2023    (TW) ................. 112120721

(51) Int. Cl.
*H05K 1/02*      (2006.01)

(52) U.S. Cl.
CPC ......... *H05K 1/0225* (2013.01); *H05K 1/0219* (2013.01); *H05K 2201/09609* (2013.01)

(58) Field of Classification Search
CPC ..... H05K 1/116; H05K 1/0219; H05K 1/0225
See application file for complete search history.

(56) References Cited

U.S. PATENT DOCUMENTS 5,828,555 A * 10/1998 Itoh ...................... H05K 1/0221
                                                                             439/74
2019/0207286 A1 * 7/2019 Moallem .............. H01Q 1/2283

* cited by examiner

*Primary Examiner* — Jeremy C Norris
(74) *Attorney, Agent, or Firm* — Dority & Manning, PA

(57) ABSTRACT

A carrier structure is provided, in which a ground layer is formed on a dielectric body, a circuit layer is formed in the dielectric body, and a conductive via is formed in the dielectric body and electrically connected to the circuit layer and the ground layer, where the ground layer has at least one first groove that exposes a surface of the dielectric body, so that the noise of the circuit layer is easy to spread out of the dielectric body, so as to prevent the problem of crosstalk from occurring in the circuit layer.

10 Claims, 5 Drawing Sheets

CARRIER STRUCTURE

BACKGROUND

1. Technical Field

The present disclosure relates to a semiconductor packaging technology, and more particularly, to a carrier structure that can improve electrical quality.

2. Description of Related Art

With the evolution of science and technology and the vigorous development of the electronic industry, electronic products are gradually developing towards a trend of high performance, wherein more and more electronic products require high frequency and high speed (such as 5G).

FIG. 1A and FIG. 1B are schematic views of a conventional package substrate 1. In the conventional package substrate 1, a ground layer 11 is formed on the opposite two surfaces 10a, 10b of a dielectric body 10 of the conventional package substrate 1, signal lines 13 and guard lines 12 are embedded in the dielectric body 10, and a plurality of conductive vias 100 electrically connected to the ground layer 11 and the guard lines 12 are formed in the dielectric body 10.

With the increasing demand of electronic products for high-frequency and high-speed signal transmission, the electrical insertion loss of the signal lines 13 in the conventional package substrate 1 is becoming more and more serious. Therefore, the dielectric body 10 of the package substrate 1 can be made by using a low-loss (low Dk/Df) dielectric material to reduce signal attenuation and improve signal integrity.

However, in the conventional package substrate 1, the ground layer 11 is formed on the entire surface of the opposite two surfaces 10a, 10b of the dielectric body 10, so that the noise between the signal lines 13 is not easy to spread out of the dielectric body 10, thereby resulting in that each of the signal lines 13 is prone to crosstalk problems due to mutual electrical coupling. Therefore, the electrical quality of electronic products using the package substrate 1 is often poor under high-frequency and high-speed (such as 5G) specifications.

Therefore, how to overcome the above-mentioned drawbacks of the prior art has become an urgent issue to be solved at present.

SUMMARY

In view of the various deficiencies of the prior art, the present disclosure provides a carrier structure, comprising: a dielectric body; a ground layer formed on the dielectric body and having at least one first groove exposing a portion of a surface of the dielectric body; a circuit layer formed in the dielectric body, wherein the circuit layer includes at least one guard line and at least one signal line; and a conductive via formed in the dielectric body and electrically connected to the circuit layer and the ground layer, wherein the conductive via is connected to the guard line and free from being connected to the signal line.

In the aforementioned carrier structure, a position of the first groove is staggered from a position of the conductive via.

In the aforementioned carrier structure, the signal line is used for high-frequency signal transmission. For example, a position of the first groove is correspondingly superimposed on an area of the guard line. Alternatively, a width of the first groove is less than a width of the guard line.

Further, the guard line is formed with at least one second groove whose position is staggered from the conductive via. For example, a plurality of the second grooves are formed on the guard line, and the plurality of second grooves on the guard line are arranged symmetrically with each other.

In the aforementioned carrier structure, the present disclosure further comprises an insulating material formed in the first groove. For example, the insulating material is the same as or different from a material for forming the dielectric body.

It can be seen from the above that, in the carrier structure of the present disclosure, the first grooves are formed in the ground layer, so that the noise of the circuit layer is easy to spread out of the dielectric body, so as to prevent the problem of crosstalk from occurring in the circuit layer. Therefore, compared with the prior art, the carrier structure of the present disclosure can improve the electrical quality of the electronic products after being applied to high-frequency and high-speed electronic products.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "on," "a," "one" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

Figure 1A:
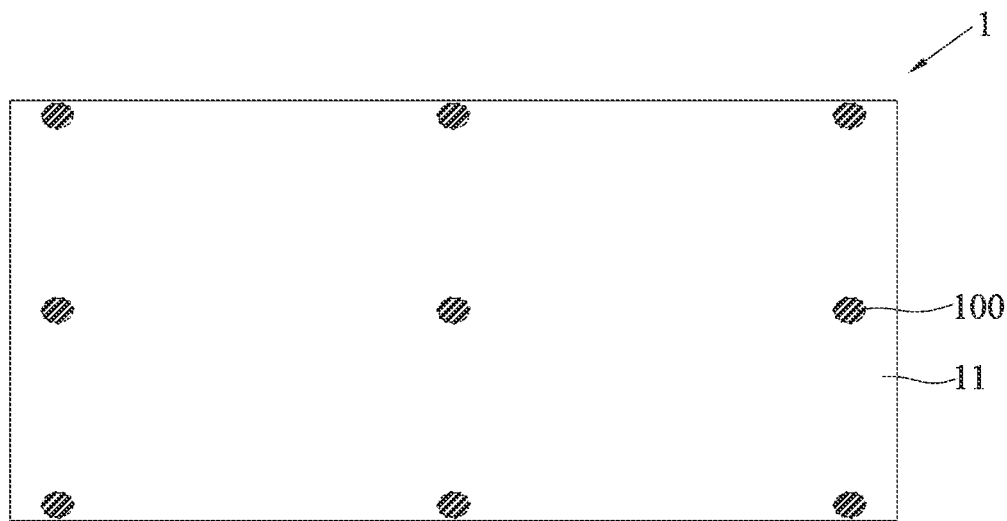
FIG. 1A is a schematic top plan view of a conventional package substrate.
Figure 1B:
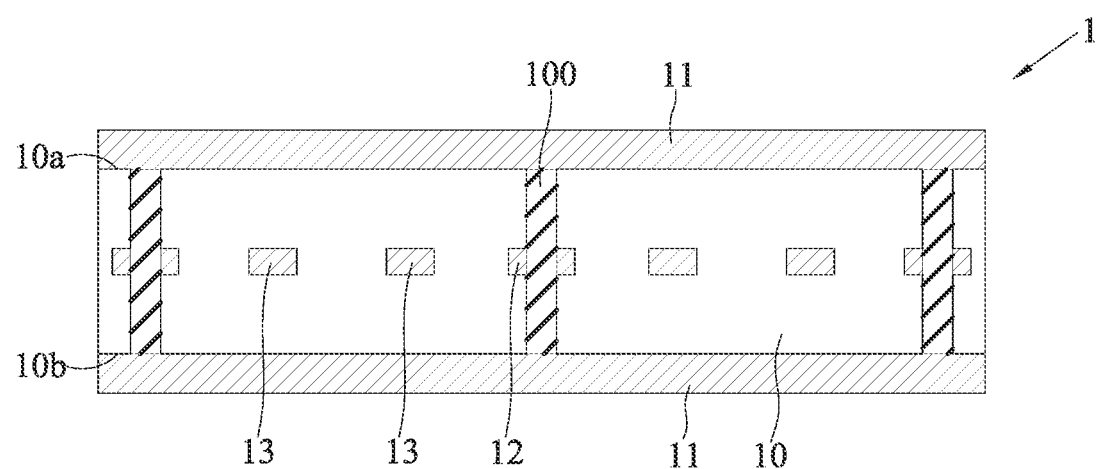
FIG. 1B is a schematic cross-sectional view of the conventional package substrate.
Figure 2:
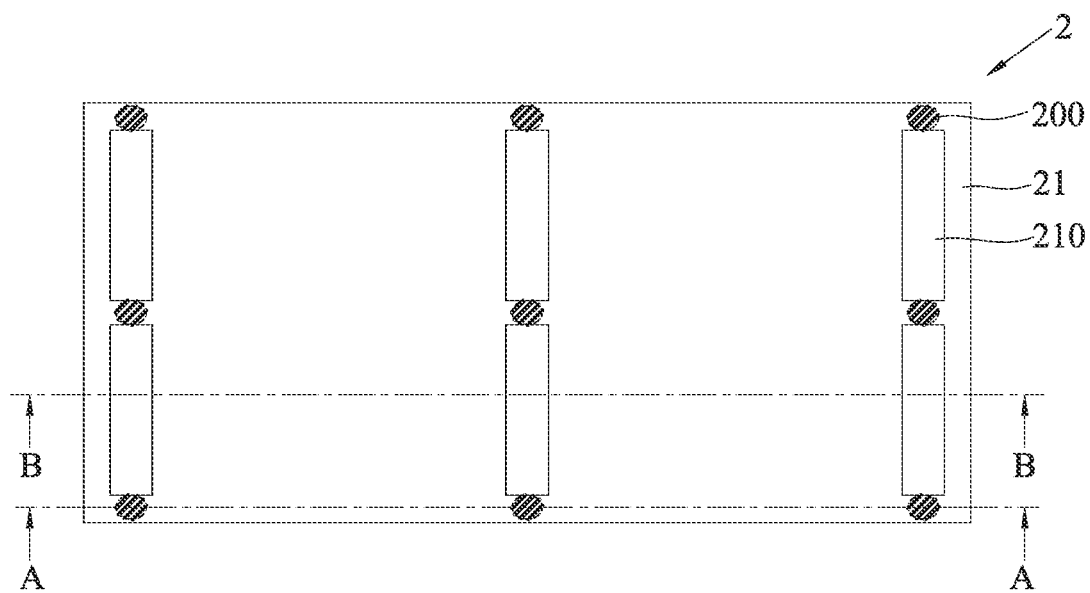
FIG. 2 is a schematic top plan view of a carrier structure according to the present disclosure.
Figure 3A:
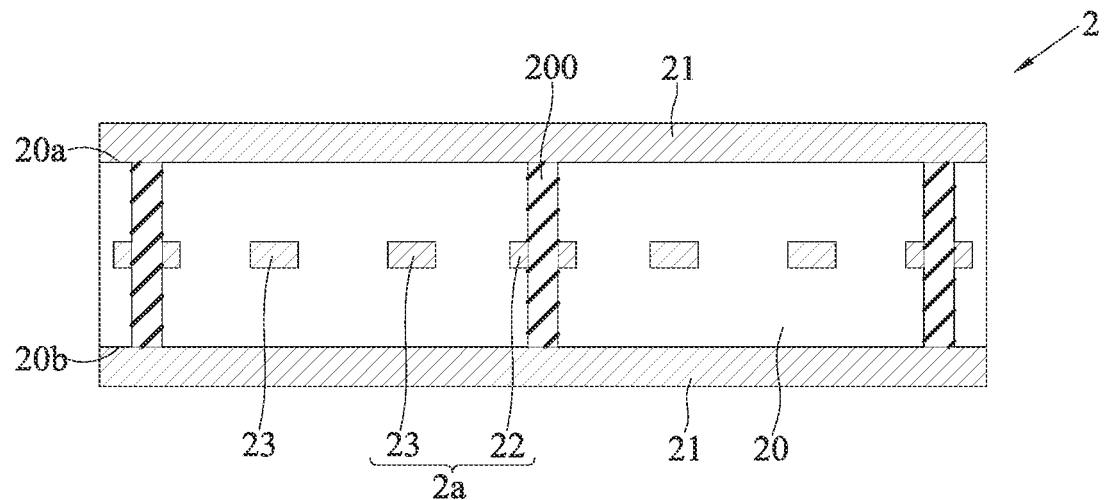
FIG. 3A is a schematic cross-sectional view of the AA section line in FIG. 2.

FIG. 2 is a schematic top plan view of a carrier structure 2 according to the present disclosure. The carrier structure 2 is a package substrate with a core layer or a package substrate that is coreless, as shown in FIG. 3A, and the carrier structure 2 comprises: a dielectric body 20, at least one ground layer 21 formed on the dielectric body 20, at least one circuit layer 2a formed in the dielectric body 20, and at least one conductive via 200 formed in the dielectric body 20 to electrically connect the circuit layer 2a and the ground layer 21.

The dielectric body 20 has two opposite surfaces 20a, 20b, and the main material of the dielectric body 20 is polybenzoxazole (PBO), polyimide (PI), prepreg (PP), or other dielectric materials.

Figure 3B:
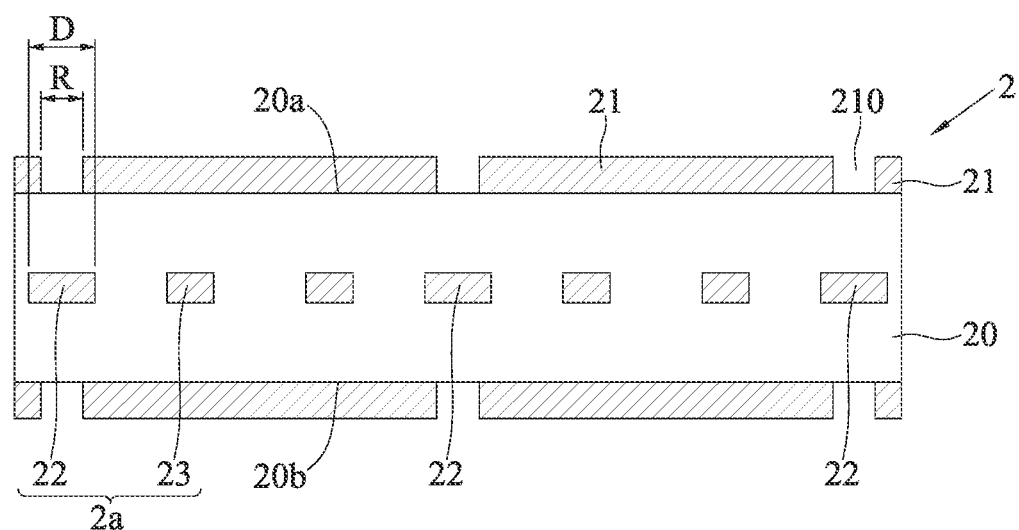
FIG. 3B is a schematic cross-sectional view of the BB section line in FIG. 2.

The ground layer 21 is a copper layer formed on at least one of the two opposite surfaces 20a, 20b of the dielectric body 20, and the ground layer 21 has at least one first groove 210 exposing a portion of the surface 20a, 20b of the dielectric body 20, as shown in FIG. 3B.

In an embodiment, the position of the first groove 210 is staggered from the position of the conductive via 200, as shown in FIG. 2.

The circuit layer 2a is in the form of a redistribution layer (RDL) and includes at least one guard line 22 and at least one signal line 23, and the conductive via 200 is connected to the guard line 22 and free from being connected to the signal line 23.

In an embodiment, the signal line 23 is used for high-frequency signal transmission (for example, the frequency used by 5G mobile communication devices is above 28 GHz).

Moreover, the position of the first groove 210 is correspondingly superimposed on the area of the guard line 22, as shown in FIG. 3B, and a width R of the first groove 210 is less than a width D of the guard line 22.

Figure 3C:
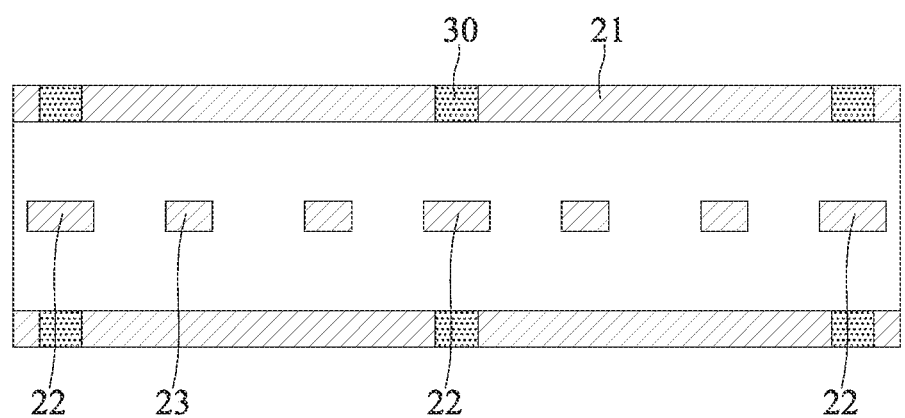
FIG. 3C is a schematic cross-sectional view of another embodiment of the carrier structure according to the present disclosure.

In addition, an insulating material 30 can be formed in the first groove 210 according to requirements, as shown in FIG. 3C. For example, the insulating material 30 is a dielectric material such as polybenzoxazole (PBO), polyimide (PI), prepreg (PP) or other dielectric materials, or a solder-resist material such as solder mask (e.g., green paint), graphite or other solder-resist materials. It should be understood that the insulating material 30 and the material forming the dielectric body 20 can be the same or different.

Therefore, in the carrier structure 2 of the present disclosure, the ground layer 21 has the first groove 210 formed in the area corresponding to the guard line 22, so that the noise between the signal lines 23 is easy to spread out of the dielectric body 20, so as to avoid the problem of crosstalk between the signal lines 23 due to mutual electrical coupling. Therefore, compared with the prior art, the carrier structure 2 of the present disclosure can improve the electrical quality of the electronic products after being applied to high-frequency and high-speed (such as 5G) electronic products.

Figure 4:
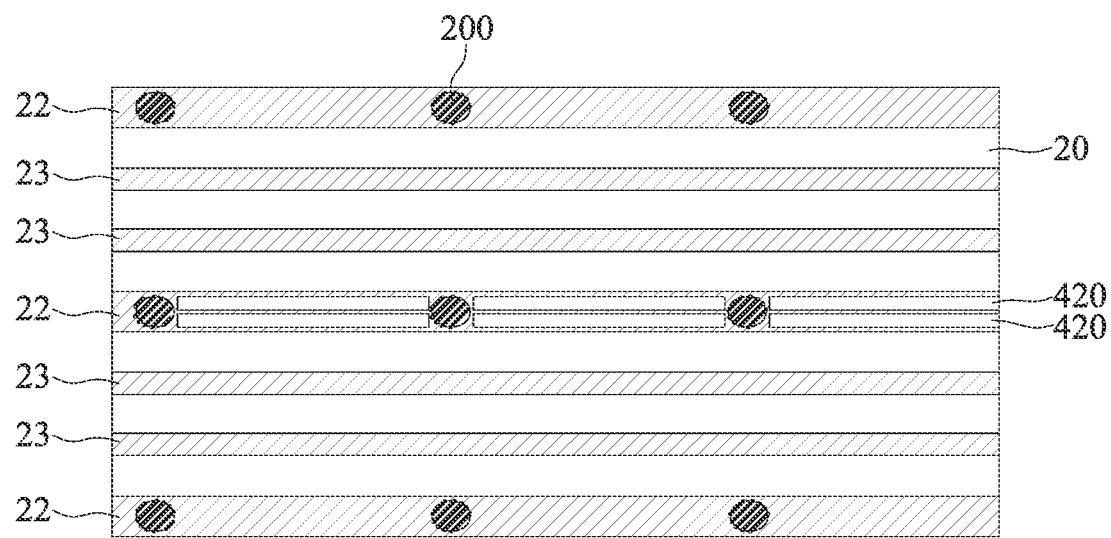
FIG. 4 is a schematic top perspective view of yet another embodiment of the carrier structure according to the present disclosure.

In addition, as shown in FIG. 4, in yet another embodiment, the guard line 22 may be formed with at least one second groove 420 whose position is staggered from the conductive via 200, so as to prevent crosstalk from occurring between the signal lines 23. For example, the guard line 22 is formed with a plurality of the second grooves 420, such as two, and the plurality of second grooves 420 are arranged symmetrically to each other.

In summary, in the carrier structure of the present disclosure, the grooves (such as the first groove 210 and the second groove 420) are formed on at least one circuit (such as the ground layer 21 and the guard line 22) that is not used to transmit signals, so that the noise between the signal lines 23 is easy to disperse from the dielectric body 20, so as to avoid the problem of crosstalk between the signal lines 23 due to mutual electrical coupling. Therefore, the carrier structure 2 of the present disclosure can improve the electrical quality of the electronic products after being applied to high-frequency and high-speed electronic products.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. A carrier structure, comprising:
a dielectric body;
a ground layer formed on the dielectric body and having first grooves exposing a portion of a surface of the dielectric body;
a circuit layer formed in the dielectric body, wherein the circuit layer includes at least one guard line and at least one signal line; and
conductive vias formed in the dielectric body and electrically connected to the circuit layer and the ground layer, wherein each conductive via is connected to the guard line and free from being connected to the signal line, and each first groove is positioned between adjacent two conductive vias.

2. The carrier structure of claim 1, wherein a position of each first groove is staggered from a position of each conductive via.

3. The carrier structure of claim 1, wherein the signal line is used for high-frequency signal transmission.

4. The carrier structure of claim 1, wherein a position of each first groove is correspondingly superimposed on an area of the guard line.

5. The carrier structure of claim 1, wherein a width of each first groove is less than a width of the guard line.

6. The carrier structure of claim 1, wherein the guard line is formed with at least one second groove whose position is staggered from each conductive via.

7. The carrier structure of claim 6, wherein a plurality of the second grooves are formed on the guard line.

8. The carrier structure of claim 7, wherein the plurality of second grooves on the guard line are arranged symmetrically with each other.

9. The carrier structure of claim 1, further comprising an insulating material formed in each first groove.

10. The carrier structure of claim 9, wherein the insulating material is the same as or different from a material for forming the dielectric body.

* * * * *